United States Patent [19]
Bauder

[11] Patent Number: 5,975,715
[45] Date of Patent: Nov. 2, 1999

[54] TAILLIGHT FIXTURE FOR MOTOR VEHICLES WITH PRINTED CIRCUIT BOARDS WITH CONNECTORS AND LED'S

[75] Inventor: Rudolf Bauder, Oberreichenbach, Germany

[73] Assignee: Reitter & Schefenacker GmbH & Co. KG, Esslingen, Germany

[21] Appl. No.: 08/907,693

[22] Filed: Aug. 8, 1997

[30] Foreign Application Priority Data

Nov. 30, 1996 [DE] Germany .................. 196 49 722

[51] Int. Cl.⁶ .................................................. N01R 33/00
[52] U.S. Cl. .................. 362/226; 362/800; 362/473; 362/498; 439/834
[58] Field of Search .................... 439/834, 36, 44, 439/842, 844, 845, 856, 858; 362/226, 800, 473, 498, 499

[56] References Cited

U.S. PATENT DOCUMENTS

| | | | |
|---|---|---|---|
| 4,647,140 | 3/1987 | Crawford | 339/176 |
| 4,752,254 | 6/1988 | Inoue | 439/834 |
| 5,399,820 | 3/1995 | Silfvast | 200/314 |

*Primary Examiner*—Sandra O'Shea
*Assistant Examiner*—Marshall Honeyman
*Attorney, Agent, or Firm*—Robert W. Becker & Associates

[57] ABSTRACT

A motor vehicle taillight fixture has a first printed board having at least one electric connector for contacting an electric supply line. The first printed board has at least one plug-in contact. A second printed board has at least one plug-in connector for receiving the at least one plug-in connector. LEDs are connected to the second printed board.

18 Claims, 3 Drawing Sheets

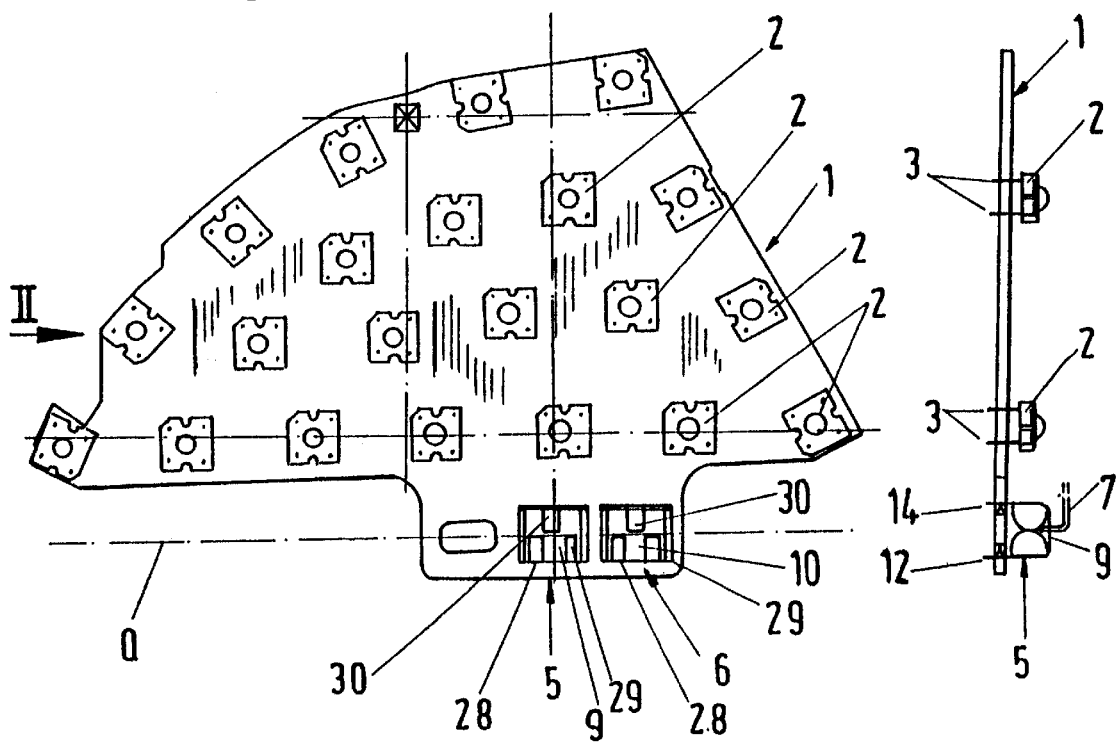

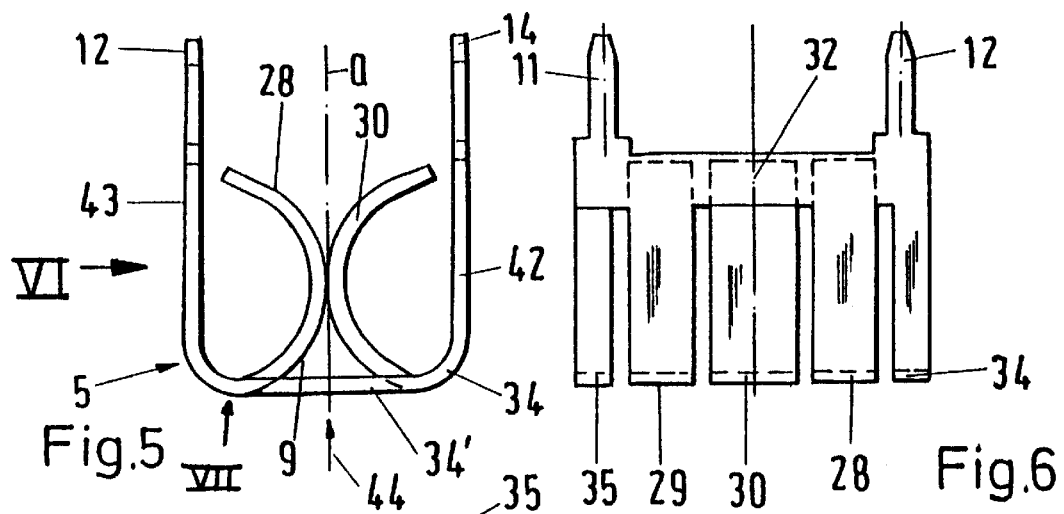
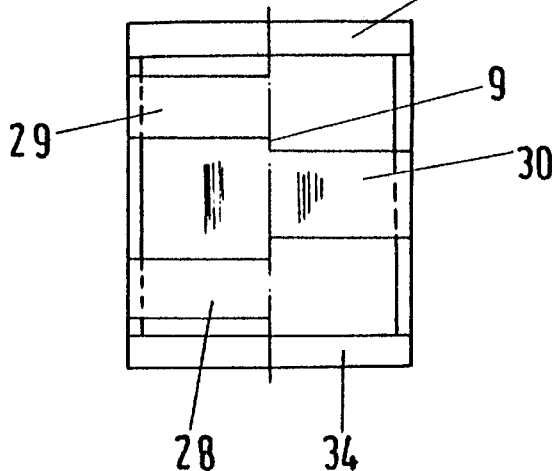
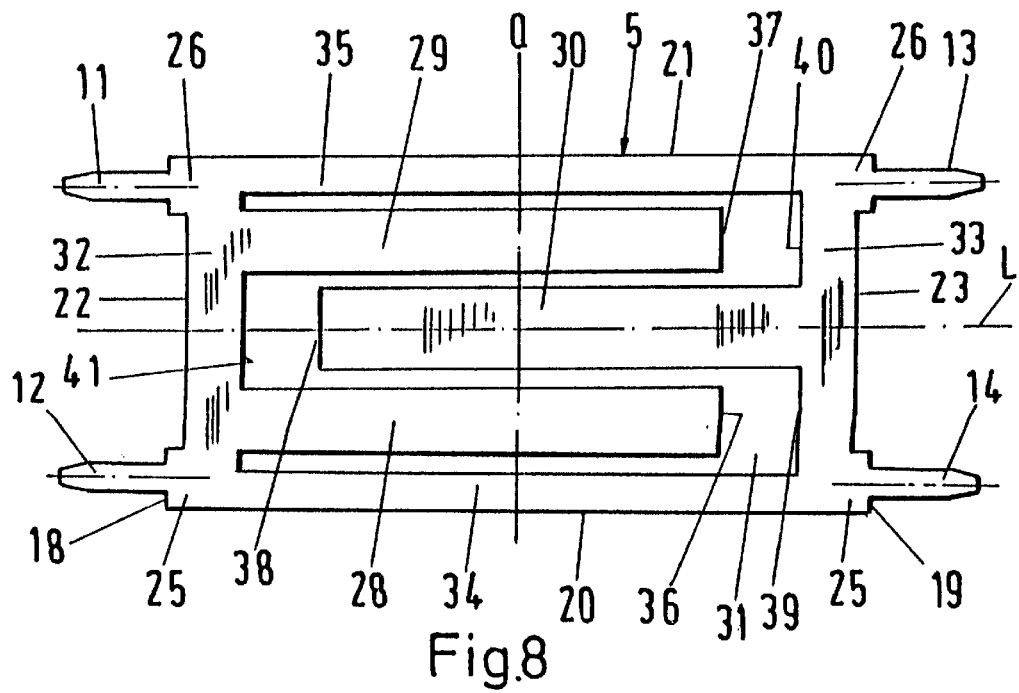

TAILLIGHT FIXTURE FOR MOTOR VEHICLES WITH PRINTED CIRCUIT BOARDS WITH CONNECTORS AND LED'S

BACKGROUND OF THE INVENTION

The present invention relates to a taillight fixture for motor vehicles with at least one printed board having at least one connector for an electrical supply line and receiving openings for lighting devices.

In known taillight fixtures of this kind, the receiving openings of the printed board receive different types of incandescent lamps for the brake light, the taillight or the turn signal. The electrical supply is provided by cable lug connectors that require time consuming and expensive mounting.

It is therefore an object of the present invention to improve a taillight fixture of the aforementioned kind such that it can be manufactured and mounted easily and inexpensively.

SUMMARY OF THE INVENTION

The motor vehicle taillight fixture according to the present invention is primarily characterized by:

A first printed board having at least one connector for contacting an electric supply line;

The first printed board having at least one plug-in contact;

A second printed board having at least one plug-in connector for receiving the at least one plug-in contact;

LEDs connected to the second printed board;

Advantageously, the plug-in connector comprises pins extending through an opening of the second printed board and the pins are fastened to the opening by soldering.

The plug-in connector preferably comprises at least two springy tongues.

The tongues are preferably bent to a semi-circular shape.

The plug-in connector preferably has a U-shape and two legs connected by a transverse bar.

The tongues are preferably positioned between the legs.

The tongues extend upwardly from the transverse bar.

The legs have free ends and each one of the free ends has at least one of the pins connected thereto.

The free ends of the tongues and the free ends of the legs are positioned substantially at the same level.

The tongues preferably have identical length.

The tongues are preferably positioned opposite one another.

The taillight may comprise three such tongues, wherein a centrally arranged one of the tongues is positioned opposed to the other two of the tongues and wherein the centrally arranged tongue is curved oppositely to the other two tongues.

The centrally arranged tongue has a greater width than the other two tongues.

The other two tongues are preferably congruently arranged when viewing the plug-in connector in an end view onto the U-shape.

Advantageously, the plug-in connector is stamped as a rectangular sheet metal piece and folded into the U-shape.

The plug-in connector is symmetrical relative to a longitudinal center plane of the rectangular sheet metal piece.

The tongues, when viewing the plug-in connector in a top view, abut a transverse center plane positioned perpendicularly to the longitudinal center plane.

The tongues viewed in the top view define a tapering insertion opening in an insertion direction of the at least one plugin contact.

A longitudinal center plane of the centrally arranged tongue coincides with the longitudinal center plane of the rectangular sheet metal piece.

The inventive taillight fixture can be easily and quickly mounted. The printed board containing the LEDs simply receives the plug-in contact of the printed board with the electric connector. Complicated soldering work is no longer required. The printed boards can be produced in a simple and inexpensive manner. The LEDs are also inexpensive components. They can be used as the turn signal light, the brake light, and the actual taillight for the motor vehicle taillight fixture. Depending on the respective use, the LEDs have different colors.

BRIEF DESCRIPTION OF THE DRAWINGS

The object and advantages of the present invention will appear more clearly from the following specification in conjunction with the accompanying drawings, in which:

FIG. 1 is a plan view onto a printed board with LEDs as well as a plug-in connector of the inventive taillight fixture;

FIG. 2 shows the printed board according to FIG. 1 in a view according to arrow II of FIG. 1;

FIG. 5 shows one of the plug-in connectors according to FIG. 1 in an end view in an enlarged representation;

FIG. 6 shows the plug-in connector according to FIG. 5 in a side view according to arrow VI in FIG. 5;

FIG. 7 shows a plan view (top view) onto the plug-in connector according to VII in FIG. 5;

FIG. 8 shows the plug-in connector according to FIG. 5 in a developed projection.

DESCRIPTION OF THE PREFERRED EMBODIMENTS

Figures 3, 4:
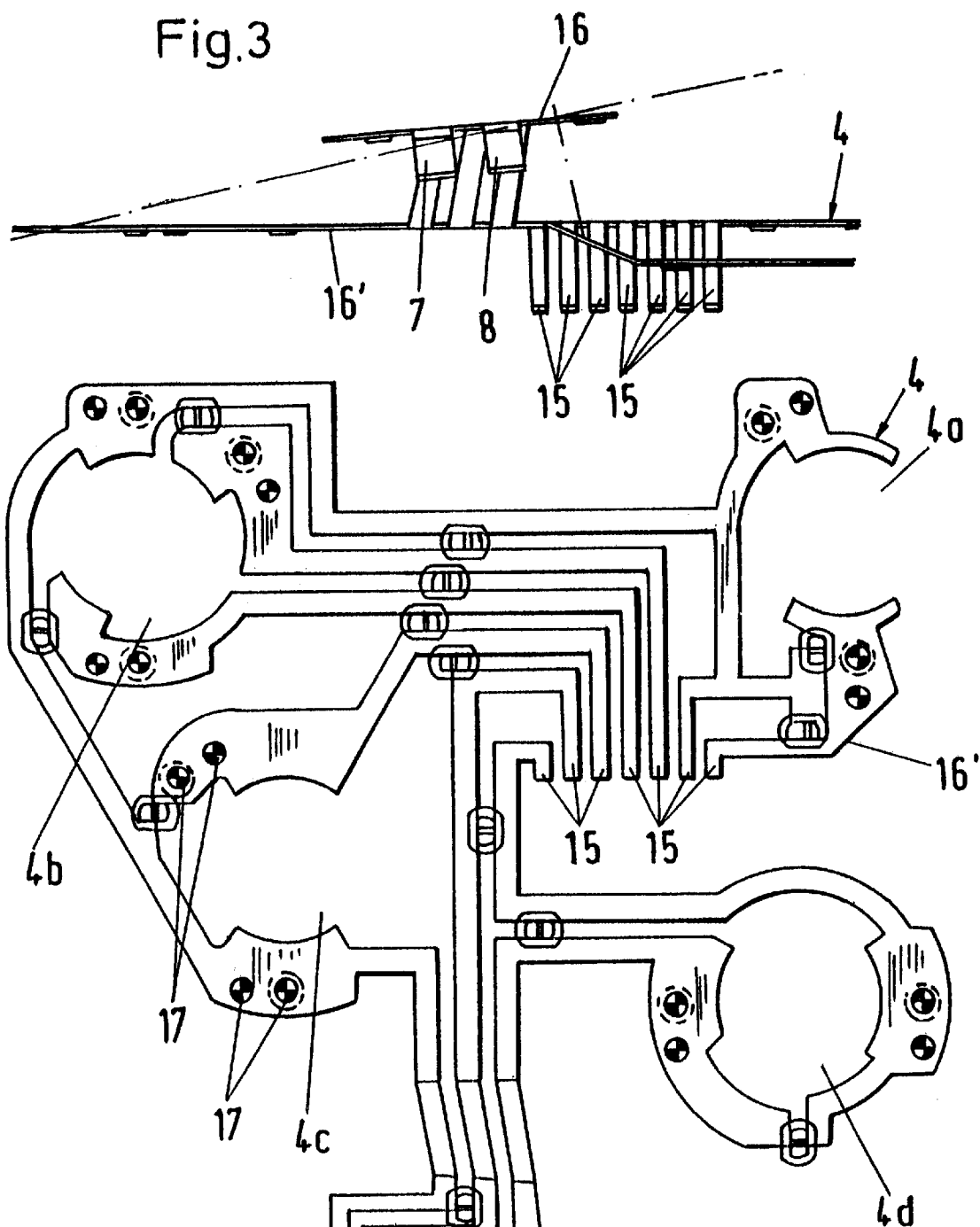
FIG. 3 shows a printed board of the inventive taillight fixture in a view according to arrow III of FIG. 4.
FIG. 4 shows a plan view onto the printed board according to FIG. 3.

The present invention will now be described in detail with the aid of specific embodiments utilizing FIGS. 1 through 8.

The printed boards represented in FIGS. 1 through 8 as well as the plug-in connector are part of a taillight fixture for a motor vehicle.

The printed board 1 according to FIGS. 1 and 2 supports a plurality of LEDs 2 which are soldered with their legs 3 onto the printed board. The electric supply to the LEDs is provided via the two plug-in connectors 5, 6 via which the printed board 1 is connected to another printed board 4.

The printed board 4 (FIGS. 3 and 4) comprises plug-in contacts 7 and 8 which are tab-shaped and can be plugged into the receiving openings 10 of the plug-in connectors 5, 6 of printed board 1. The plug-in connectors 5, 6 are fastened with pins 11 through 14 (FIG. 8) extending through corresponding plug-in openings of the printed board to the printed board 1 by soldering.

The printed board 4 is comprised in a manner known per se of an electrically conducting material, preferably of zinc-coated sheet metal. It comprises non-represented plus and minus supply lines for incandescent lights which are received in receiving openings 4a through 4d (FIG. 4). The printed board 4 is fastened to the back side of a non-represented reflector housing of the motor vehicle taillight fixture, preferably, by high temperature deformation of plastic rivets which are inserted through openings 17 of the printed board 4.

The printed board 4 has a plurality of contacts 15 arranged adjacent to one another for contacting a non-represented multiple terminal plug. The electric supply from the vehicle battery is achieved with these contacts 15. The plug-in contacts 7 and 8 are provided at a portion of the printed board 4 which is bent out of the plane of the printed board 4 (see reference numeral 16 in FIG. 3) so that they extend substantially perpendicularly toward a plate portion 16' of the printed board 4.

In FIGS. 5 through 8, the plug-in connector 5 is shown in detail. The other plug-in connector 6 is of the same design and will therefore not be disclosed in more detail.

As shown especially in FIG. 8, the plug-in connector 5 is produced from sheet metal preferably by stamping. The pins 11 through 14 are of identical construction. They project past the narrow sides 18 and 19 of the substantially rectangular stamped sheet metal piece 5. The pins 11 through 14 are positioned relatively closely adjacent to the longitudinal sides 20 and 21 of the sheet metal piece which is essentially symmetrically embodied relative to the longitudinal center plane L.

Between the opposingly arranged pins 11, 12 and 13, 14 the narrow sides 18, 19 are provided with U-shaped cutouts 22, 23 which have a relatively large width so that at both longitudinal sides 20 and 21 projections 25 and 26 are respectively formed past which the pins 11, 12, 13, 14 extend. The pins 11–14 taper in the area of their free ends preferably in a trapezoidal shape in order to ensure easy introduction into the corresponding plug-in openings of the printed board 1.

Between the two oppositely arranged longitudinal edges 20 and 21 the tongues 28 to 30 are formed which are defined by a meander-shaped cutout 31. The tongues 28 through 30 are substantially of the same length and extend parallel to one another and to the longitudinal sides 20 and 21. The tongues 28 and 29 have a transition into the narrow side portion 32 with edge 22, while the tongue 30 is connected to the other narrow side portion 33 having edge 23. In the shown embodiment, the centrally arranged tongue 30 is somewhat wider than the tongues 28 and 29 which are of identical design. The tongues 28 and 29 are positioned at a same spacing to the longitudinal side portions 34 and 35 with longitudinal edges 20 and 21 as well as to the centrally arranged tongue 30. The free planar end faces 36 through 38 of the tongues 28 through 30 have a spacing to parallel extending inner edges 39 to 41 of the side portions 32, 33 that are perpendicularly arranged to the longitudinal center plane L. This spacing is greater than the distance of the tongues relative to one another.

In the developed projection represented in FIG. 8, the stamped rectangular sheet metal piece is shown which is bent to the U-shape represented in FIG. 5. The tongues 28 to 30 are inwardly bent so as to assume a semi-circular shape. The tongues 28, 29 are bent in an opposite direction to the centrally arranged tongue 30. In the end view according to FIG. 5, the tongues 28, 29 and 30 contact the transverse center plane Q of the plug-in connector 5. The tongues 28 through 30 are bent to such an extent that their ends faces 36 through 38 have only a minimal distance from the neighboring legs 42, 43 of the plug-in connector 5 (FIG. 5). The legs 42, 43 are formed by a part of the longitudinal side portions 34, 35 of the stamped sheet metal piece (FIG. 8) and are longer by about one third than the connecting transverse stay 34' (FIG. 5) which is also formed by a portion of the longitudinal side portions 34, 35 of the stamped sheet metal piece.

The tongues 28 through 30 are bent in a semi-circular shape inwardly (into the space defined by the "U" in the direction toward the free ends of the legs 42, 43 and extend upwardly substantially over the entire length of the legs 42, 43 (FIG. 5).

When the taillight fixture is mounted, the printed board 1 is fastened to the printed board 4 by inserting the plug-in contacts 7, 8 into the plug-in openings 9 and 10 in the area of the transverse stay 34' of the two plug-in connectors 5 and 6. Since the tongues 28 through 30 extend to the transverse center plane Q of the respective plug-in connector 5, 6 (FIG. 1) and are substantially semi-circularly bent into the vicinity of the legs 42, 43 (FIG. 5) the contacts 7, 8 can be simply inserted into the plug-in connector 5, 6. Due to the bent tongues 28 through 30 a tapering insertion opening 9 results in the direction of insertion 44 (FIG. 5) which allows for a simple introduction of the plug-in contacts 7, 8. Since the tongues 28 and 30 extend to the transverse center plane Q of the plug-in connector 5, 6, the tongues are resiliently deformed by the contacts 7, 8 so that they rest with sufficiently high pressure at the two sides of the contacts 7, 8. The distance that the free ends 38 through 40 of the tongues 28 through 30 have in the initial state from the legs 42, 43 of the plug-in connector 5, 6 is sufficiently great to allow the resilient (springy) deformation of the tongues 28 through 30 upon insertion of the plug-in contacts 7, 8. The contacts 7, 8 can be removed, if needed, in a simple manner from the plug-in connectors 5, 6. The printed board 1 with the plug-in connectors 5, 6 can thus be simply and quickly connected to the contacts 7, 8 of the printed board 4.

The present invention is, of course, in no way restricted to the specific disclosure of the specification and drawings, but also encompasses any modifications within the scope of the appended claims.

What I claim is:

1. A motor vehicle taillight fixture comprising:
    a first printed board having at least one electric connector for contacting an electric supply line;
    said first printed board having at least one plug-in contact;
    a second printed board having at least one plug-in connector for receiving said at least one plug-in contact;
    LEDs connected to said second printed board;
    wherein said plug-in connector comprises at least two springy tongues;
    wherein said plug-in connector has a U-shape and has two legs connected by a transverse bar.

2. A taillight fixture according to claim 1, wherein said plug-in connector comprises pins extending through an opening of said second printed board and wherein said pins are fastened to said opening by soldering.

3. A taillight fixture according to claim 1, wherein said tongues are bent to a semi-circular shape.

4. A taillight fixture according to claim 1, wherein said tongues are positioned between said two legs.

5. A taillight fixture according to claim 4, wherein said tongues extend upwardly from said transverse bar.

6. A taillight fixture according to claim 1, wherein said legs have a free end and wherein to each one of said free ends at least one of said pins is connected.

7. A taillight fixture according to claim 6, wherein free ends of said tongues and said free ends of said legs are positioned substantially at a same level.

8. A taillight fixture according to claim 1, wherein said tongues have an identical length.

9. A motor vehicle taillight fixture comprising:
    a first printed board having at least one electric connector for contacting an electric supply line;

said first printed board having at least one plug-in contact;

a second printed board having at least one plug-in connector for receiving said at least one plug-in contact;

LEDs connected to said second printed board;

wherein said plug-in connector comprises at least two springy tongues;

wherein said tongues are positioned opposite one another.

10. A taillight fixture according to claim 9, wherein said plug-in connector has a U-shape and has two legs connected by a transverse bar.

11. A taillight fixture according to claim 9, comprising three of said tongues, wherein a centrally arranged one of said tongues is positioned opposed to the other two of said tongues and wherein said centrally arranged tongue is curved oppositely to said other two tongues.

12. A taillight fixture according to claim 11, wherein said centrally arranged tongue has a greater width than said other two tongues.

13. A taillight fixture according to claim 11, wherein said other two tongues are congruently arranged when viewing said plug-in connector in an end view onto said U-shape.

14. A taillight fixture according to claim 11, wherein said plug-in connector is stamped as a rectangular sheet metal piece and folded into said U-shape.

15. A taillight fixture according to claim 14, wherein said plug-in connector is symmetrical relative to a longitudinal center plane of said rectangular sheet metal piece.

16. A taillight fixture according to claim 15, wherein said tongues, when viewing said plug-in connector in a top view, abut a transverse center plane positioned perpendicularly to said longitudinal center plane.

17. A taillight fixture according to claim 16, wherein said tongues viewed in said top view define a tapering insertion opening in an insertion direction of said at least one plug-in contact.

18. A taillight fixture according to claim 15, wherein a longitudinal center plane of said centrally arranged tongue coincides with said longitudinal center plane of said rectangular sheet metal piece.

* * * * *